(12) United States Patent
Jin et al.

(10) Patent No.: US 8,610,494 B1
(45) Date of Patent: Dec. 17, 2013

(54) LOW POWER ACTIVE FILTER

(75) Inventors: Jun-De Jin, Hsinchu (TW); Tzu-Jin Yeh, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/494,263

(22) Filed: Jun. 12, 2012

(51) Int. Cl.
*H03B 1/00* (2006.01)
(52) U.S. Cl.
USPC .......................................................... 327/557
(58) Field of Classification Search
USPC .................................. 327/551–557
See application file for complete search history.

(56) References Cited

U.S. PATENT DOCUMENTS

| 7,498,899 | B2 * | 3/2009 | Iwaki et al. | 333/133 |
| 2009/0251618 | A1 * | 10/2009 | Gao et al. | 348/731 |

OTHER PUBLICATIONS

Meenakshi Prashant, et al., "Integrated Passive Devices (IPD) Integration with eWLB (Embedded Wafer Level BGA) for High Performance RF Applications", 2010 Electronics Packaging Technology Conference Proceedings, 2010, p. 1-5.
Meng-Lin Lee, et al., "1.58-GHz Third-Order CMOS Active Bandpass Filter With Improved Passband Flatness", IEEE Transactions on Microwave Theory and Techniques, vol. 59, No. 9, Sep. 2011, p. 2275-2284.
Young-Hoon Chun, et al., "Design of an RF Low-Noise Bandpass Filter Using Active Capacitance Circuit", IEEE Transactions on Microwave Theory and Techniques, vol. 53, No. 2, Feb. 2005, p. 687-695.
Theerachet Soorapanth, et al., "A 0-dB IL 2140 30 MHz Bandpass Filter Utilizing Q-Enhanced Spiral Inductors in Standard CMOS", IEEE Journal of Solid-State Circuits, vol. 37, No. 5, May 2002, p. 579-586.

* cited by examiner

*Primary Examiner* — Lincoln Donovan
*Assistant Examiner* — Sibin Chen
(74) *Attorney, Agent, or Firm* — Eschweiler & Associates, LLC

(57) ABSTRACT

Some embodiments relate to a band-pass filter arranged in a ladder-like structure. The band-pass filter includes respective inductor-capacitor (LC) resonators arranged on respective rungs of the ladder-like structure. Respective matching circuits are arranged on a leg of the ladder-like structure between neighboring rungs.

18 Claims, 5 Drawing Sheets

400

| | Prior art 1[*] | Prior art 2[] | Prior art 3[*] | BPF 402 |
|---|---|---|---|---|
| $P_{DC}$ (mW) | 17.5 | 30 | 14.4 | 0.1   ← 404 |
| BW (MHz) | 125 | 95 | 126 | 125 |
| IL (dB) | 0 | 0.1 | 0.7 | 0.8 |
| Freq. (GHz) | 2.1 | 1.9 | 1.6 | 2.45 |
| NF (dB) | - | 4.4 | 11.4 | 9.0 |
| P1dB,in (dBm) | -13.4 | - | -15.2 | -13.0 |
| Technology | 0.25um CMOS | $f_{max}$=25GHz GaAs | 0.18um CMOS | 65nm CMOS |

[*] T. Soorapanth, IEEE JSSC, pp. 579-586, May 2002
[**] Y-H Chun, IEEE MTT, pp. 687-695, Feb. 2005
[***] M.L. Lee, IEEE MTT, pp. 2275-2284, Sept. 2011

LOW POWER ACTIVE FILTER

BACKGROUND

Band pass filters are used extensively in mobile communications systems, such as cellular phones and local area networks (LANs) for example, to suppress unwanted signals and to provide wanted signals with enough gain and at a sufficiently narrow frequency range to meet desired specifications.

BRIEF DESCRIPTION OF THE DRAWINGS

FIG. 4 is a chart illustrating reduced power consumption of an exemplary band-pass filter relative to several prior art band-pass filters.

DETAILED DESCRIPTION

Figure 1A:
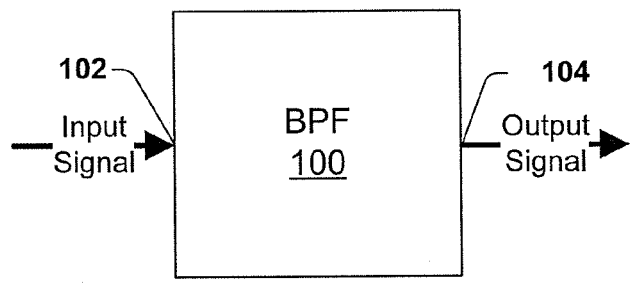
FIG. 1A shows a conventional band-pass filter having an input terminal and an output terminal.

The present disclosure will now be described with reference to the drawings wherein like reference numerals are used to refer to like elements throughout, and wherein the illustrated structures are not necessarily drawn to scale. It will be appreciated that this detailed description and the corresponding figures do not limit the scope of the present disclosure in any way, and that the detailed description and figures merely provide a few examples to illustrate some ways in which the inventive concepts can manifest themselves.

Figure 1B:
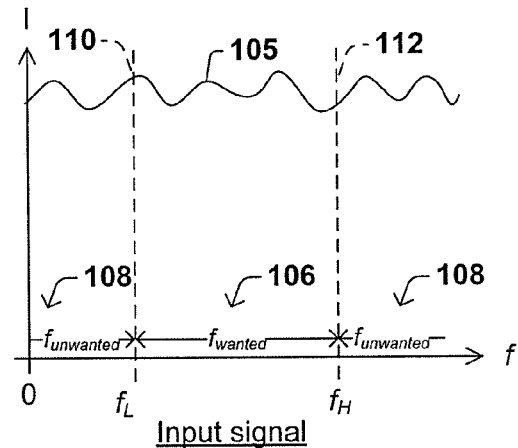
FIG. 1B shows an input signals for FIG. 1A's band-pass filter.
Figure 1C:
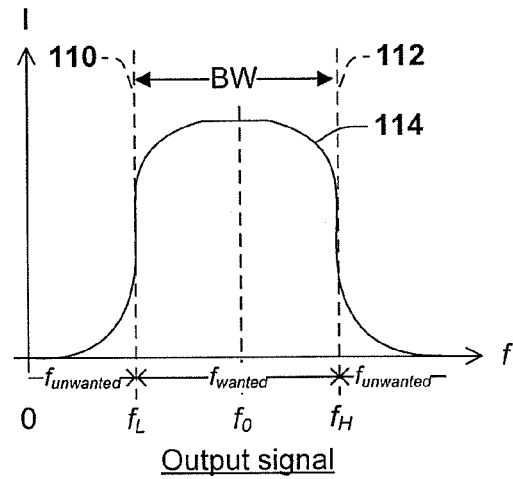
FIG. 1C shows an output signal for FIG. 1A's band-pass filter.

FIG. 1 illustrates the operation of a conventional band pass filter (BPF) 100 having an input terminal 102 and an output terminal 104. During operation, the BPF 100 receives an input signal at the input terminal 102. As shown in FIG. 1B, input signal 105 can include a wide range of frequency components (e.g., wanted frequency components 106 and unwanted frequency components 108). In a wireless communication device, such as a cellular phone for example, the wanted frequency components 106 could correspond to data encoded on a modulated carrier wave within a wanted frequency range, and the un-wanted frequency components (e.g., noise) could be other signals in the unwanted frequency range 108. To isolate the wanted frequency components 106, the band-pass filter 100 is structured to attenuate input frequencies which are less than lower cut-off frequency, $f_L$ 110 and which are greater than cut-off frequency, $f_H$ 112. This produces an output signal 114 (FIG. 1C) in the wanted frequency range, which can be for example centered about a center frequency $f_0$.

Although many types of band-pass filters are known, conventional band-pass filters consume a significant amount of power due to the fact they often include large capacitors, inductors, and/or transmission lines. Unfortunately, in today's era of portable electronic devices that are battery-powered, this significant power consumption reduces the operational lifetime of a portable electronic device from one charging to the next. Accordingly, the present disclosure relates to techniques for providing ultra low power band-pass filters. These ultra-low power band-pass filters help to extend the useful lifetime of portable devices to help end users get more productivity from their portable devices.

Figure 2:
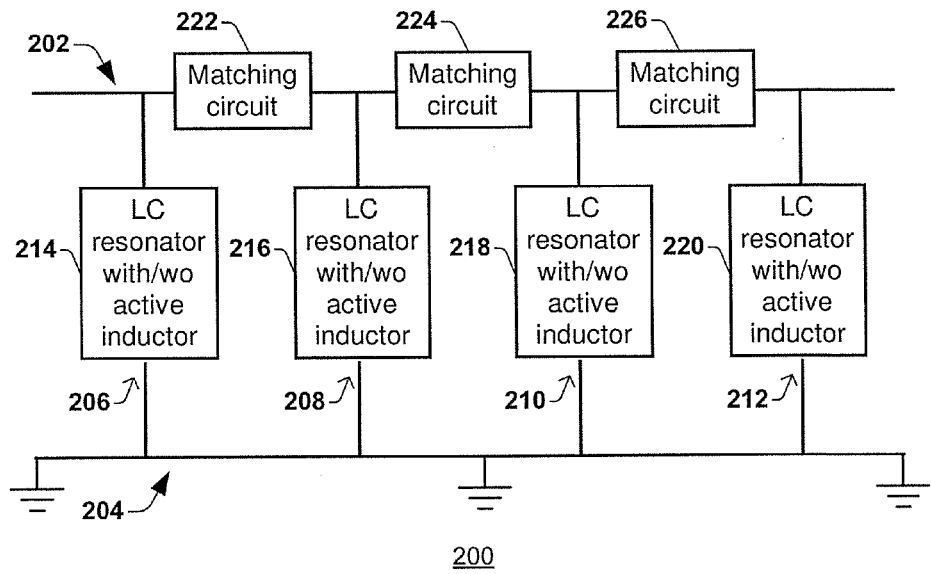
FIG. 2 shows a band-pass filter in accordance with some embodiments.

FIG. 2 illustrates a schematic for a low power band-pass filter 200 in accordance with some embodiments. The band-pass filter 200 has a ladder-like structure made up of legs 202, 204 and rungs 206-212. Along each rung is an inductor-capacitor (LC) resonator that can, but does not necessarily, include an active inductor. Thus, a first LC resonator 214 is positioned on first rung 206, a second LC resonator 216 is positioned on second rung 208, a third LC resonator 218 is positioned on third rung 210, and fourth LC resonator 220 is positioned on fourth rung 212. Matching circuits 222, 224, 226 are disposed along first leg 202 between neighboring rungs. For example, a first matching circuit 222 is arranged on the first leg 202 between the first and second rungs 206, 208. The second leg 204 is coupled to a DC supply voltage, such as ground, for example. It will be appreciated that because FIG. 2 illustrates a schematic view rather than a layout view, and the actual layout may appear ladder-like but it may also appear to be non-ladder like because of interconnect routing and component placement.

One or more of the LC resonators 216-220 include an active inductor, which helps to reduce power consumption significantly relative to previous low-pass band pass filters. For example, in some embodiments, the second and third LC resonators 216, 218 each include an active inductor; while in other embodiments, the first, second, third and fourth resonators 214-220 include respective active inductors. These active inductors limit current leakage (e.g., current leaked to ground), and thereby limit power consumption during operation of the BPF 200.

Figure 3:
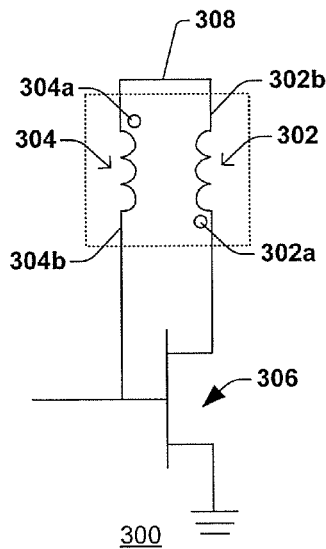
FIG. 3 shows an active inductor that can be used in FIG. 2's band-pass filter.

FIG. 3 shows an example of an active inductor 300 that can help limit power consumption in accordance with some embodiments. The active inductor 300 includes a pair of coupled inductors 302, 304, which are in close proximity such that current in one inductor induces a voltage in the other inductor. The dot (e.g., 302a or 304a)—or current input terminal—symbolizes the side of the inductor from where the current is supposed to enter that inductor. Thus, in FIG. 3, the first inductor 302 has a current input terminal 302a coupled to the drain of transistor 306 and has a current output terminal 302b coupled to transmission line 308. The second inductor 304 has a current input terminal 304a coupled to transmission line 308, and has a current output terminal 304b coupled to the gate of transistor 306. The inductance values of the first and second inductors 302, 304 (along with length and width of transistor 306) are set to predetermined values during the design phase to help establish a passband corresponding to a wanted frequency range.

FIG. 4 shows a chart 400 illustrating several performance characteristics of one BPF embodiment 402 in accordance with this disclosure compared with several prior art approaches. As shown, the BPF embodiment 402 has a DC power consumption 404 (e.g, 0.1 mW) that is less than 1% of the power consumptions for each of the other prior art circuits. As for the other performance characteristics, the BPF embodiment 402 is similar in many regards. Although FIG. 4 is not meant to be representative of all power consumptions for all BPFs in any way, it does tend to show that the proposed implementations can provide significant power savings compared to some prior art approaches.

Figure 5:
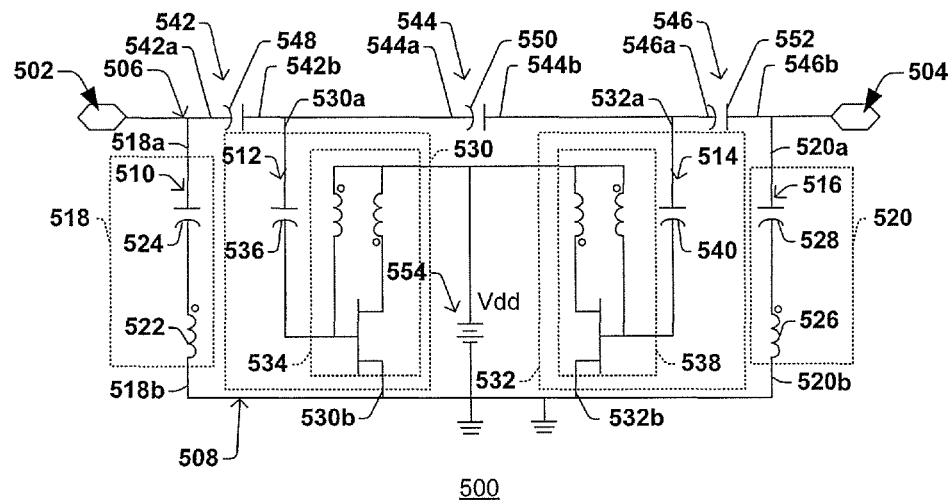
FIG. 5 shows a band-pass filter in accordance with some embodiments.

FIG. 5 depicts another embodiment of a band-pass filter 500 having an input terminal 502 and an output terminal 504. Although the input and output terminals are referred to as "input" and "output", these terminals may be largely interchangeable in some embodiments due to symmetries of the circuitry involved.

Like FIG. 2's embodiment, the band pass filter 500 is arranged in a ladder-like structure including legs (e.g., 506, 508) and rungs (e.g., 510-516). On first and fourth rungs 510, 516, respectively, first and fourth inductor-capacitor (LC) resonators 518, 520, respectively are arranged. On second and third rungs 512, 514, respectively, second and third inductor capacitors 530, 532 are arranged. A DC supply voltage 554 biases second and third LC resonators 530, 532.

The first LC resonator 518 is made up of passive inductor 522 and passive capacitor 524 and has first and second LC terminals 518a, 518b. The fourth LC resonator 520 is made up of passive inductor 526 and passive capacitor 528 and also has seventh and eighth LC terminals 520a, 520b.

The second LC resonator 530 is made up of active inductor 534 and passive capacitor 536 and has third and fourth LC terminals 530a, 530b. The third LC resonator 532 is also made up of an active inductor 538 and passive capacitor 540 and has fifth and sixth LC terminals 532a, 532b.

First, second, and third matching circuits 542, 544, 546, respectively are arranged between neighboring rungs. The first matching circuit 542, which has first and second matching circuit terminals 542a, 542b with capacitor 548 therebetween, has its first matching circuit terminal 542a coupled to the BPF input terminal 502 and second matching circuit terminal 542b. The second matching circuit 544 has third and fourth terminals 544a, 544b with capacitor 550 therebetween. A third matching circuit 546 has fifth and sixth terminals 546a, 546b with capacitor 552 therebetween.

Figure 6:
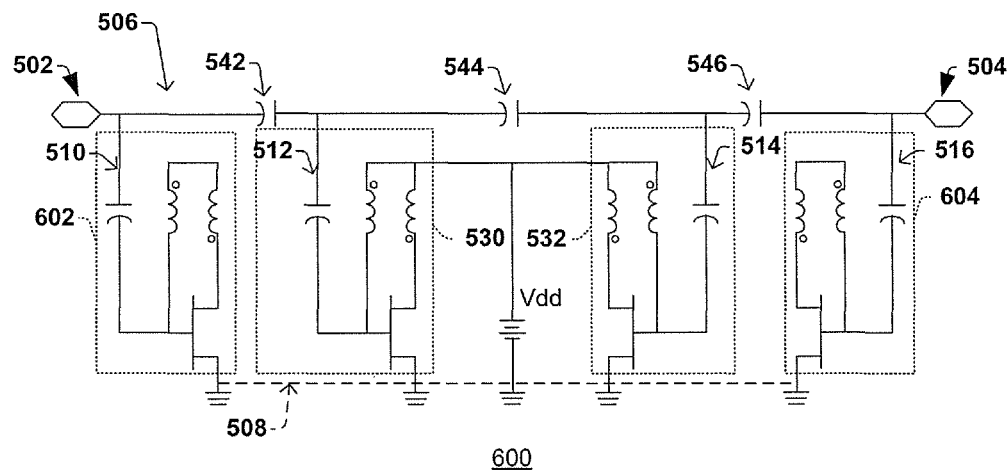
FIG. 6 shows a band-pass filter in accordance with some embodiments.

FIG. 6 shows another embodiment of a BPF 600 where the passive inductors in the first and fourth LC resonators previously illustrated in FIG. 5 are replaced with active inductors. Thus, because the first and fourth LC resonators 602, 604 in FIG. 6 have active inductors rather than passive inductors, FIG. 6's BPF can provide even lower power consumption in some contexts, relative to BPF 500 in FIG. 5.

Figure 7A:
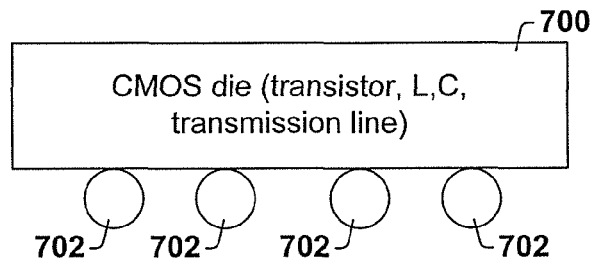
FIGS. 7A-7C illustrate three different options for packaging band-pass filters in accordance with some embodiments.
Figure 7B:
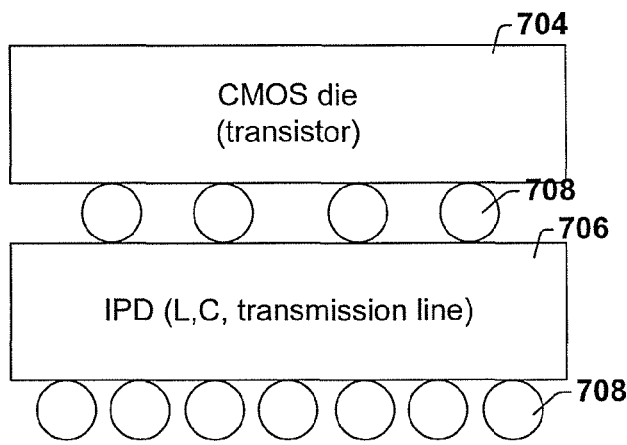
Figure 7C:
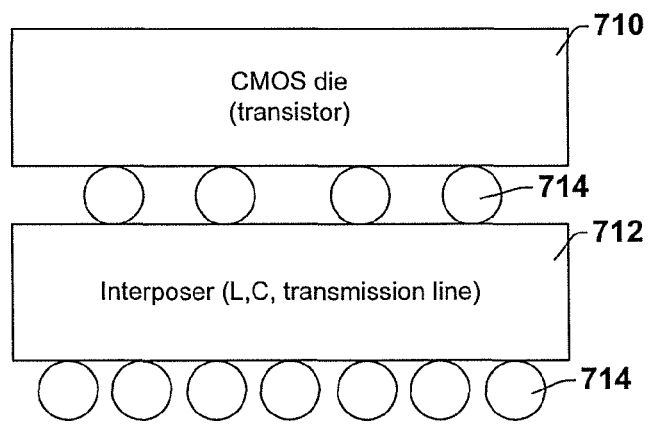

FIGS. 7A-7C show three different embodiments for packaging BPFs in accordance with this disclosure. As shown in FIG. 7A, in some embodiments, a BPF can be included on an integrated circuit die 700 with complementary metal oxide semiconductor (CMOS) devices. Thus, the active inductors, capacitors, transmission lines, and transistors of the previous BPF embodiments are all formed on the die, and are coupled to external circuits via solder bumps 702 or other conductive leads (e.g., wires or landing pads).

FIG. 7B shows another embodiment where active devices (e.g., transistors) are formed on a CMOS die 704; while passive devices, including inductors, capacitors, and transmission lines are formed on an integrated passive device (IPD) chip 706. In this implementation, the CMOS die 704 is a semiconductor substrate in which active areas are implanted and alternating layers of insulating and conducting layers are formed to form the active devices. The IPD chip 706, in contrast, although still a semiconductor substrate, can be low-conductivity silicon and can include thick copper interconnect structures. Thus, inductors, capacitors, transmission lines, and transistors of the previous BPF embodiments are formed on the IPD 706, and are coupled to transistors formed on CMOS die 704 via solder bumps 708 or other conductive leads (e.g., wires or landing pads).

FIG. 7C shows another embodiment where active devices (e.g., transistors) are formed on a CMOS die 710; while passive devices, including inductors, capacitors, and transmission lines are formed on an interposer chip 712. In this implementation, the CMOS die is a semiconductor substrate in which active areas are implanted and alternating layers of insulating and conducting layers are formed to form the active devices. The interposer chip, in contrast, although still a semiconductor substrate, can be high-conductivity silicon and can include CMOS-type interconnect. Thus, inductors, capacitors, transmission lines, and transistors of the previous BPF embodiments are formed on the interposer chip 712, and are coupled to transistors formed on CMOS die 710 via solder bumps 714 or other conductive leads (e.g., wires or landing pads). Although FIGS. 7B and 7C show only one IPD and only one interposer, respectively, it will be appreciated that IPD and interposer chips can be "stacked" in some embodiments.

Some embodiments relate to a band-pass filter arranged in a ladder-like structure. The band-pass filter includes respective inductor-capacitor (LC) resonators arranged on respective rungs of the ladder-like structure. Respective matching circuits are arranged on a leg of the ladder-like structure between neighboring rungs.

Some embodiments relate to a band-pass filter (BPF) having an input terminal and output terminal. In this BPF, a first inductor-capacitor (LC) resonator having first and second LC terminals has its first LC terminal coupled to the input terminal. A first matching circuit has first and second terminals, with the first terminal coupled to the input terminal. A second LC resonator has third and fourth LC terminals, with the third LC terminal coupled to the second terminal of the first matching circuit. A second matching circuit has third and fourth terminals, where the third terminal is coupled to the fourth LC terminal. A third inductor-capacitor (LC) resonator has fifth and sixth LC terminals, where the fifth. LC terminal is coupled to the fourth terminal of the second matching circuit. A third matching circuit has fifth and sixth terminals, where the fifth terminal is coupled to the fourth terminal of the second matching circuit. A fourth LC resonator has seventh and eight LC terminals, where the seventh LC terminal is coupled to the sixth matching terminal and to the output terminal of the band-pass filter.

Although the disclosure has been shown and described with respect to a certain aspect or various aspects, equivalent alterations and modifications will occur to others of ordinary skill in the art upon reading and understanding this specification and the annexed drawings. For example, it will be appreciated that the terms "first", "second", "third" and the like do not imply any spatial or temporal relationship therebetween, but rather are just generic identifiers. Further, these terms are interchangeable in this disclosure. For example, although one portion of this disclosure may refer to a "first" feature and a "second" feature, because first and second are merely generic identifiers, they features may also be referred to as a "second" feature and a "first" feature respectively. Further, the terms "couple", "couples", "coupled" and the like include direct and indirect coupling. For example, if element A is "coupled to" element B, element A can be in direct contact with element B; however it is also possible that element "C" is arranged between elements A and B so long as there is still an operable coupling between A and B. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the disclosure. In addition, while a particular feature of the disclosure may have been disclosed with respect to only one of several aspects of the disclosure, such feature may be combined with one or more other features of the other aspects as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A band-pass filter arranged in a ladder-like structure and comprising:
    respective inductor-capacitor (LC) resonators arranged on respective rungs of the ladder-like structure; and
    respective matching circuits arranged on a leg of the ladder-like structure between respective neighboring rungs;
    wherein at least one of the LC resonators is an active inductor comprising:
        a transistor having a gate terminal and first and second source/drain terminals;
        a first inductor having a first inductor terminal coupled to the first source/drain terminal;
        a second inductor having a first inductor terminal coupled to the gate terminal; and
        a transmission line coupled to respective second inductor terminals of the first and second inductors.

2. The band-pass filter of claim 1, wherein at least two LC resonators on neighboring rungs comprise at least two active inductors, respectively.

3. The band pass filter of claim 1, wherein the transistor, the first inductor, the second inductor and the transmission line are all formed on a single integrated circuit die having complementary metal oxide semiconductor (CMOS) devices thereon.

4. The band pass filter of claim 1, wherein the transistor is formed on an integrated circuit die having complementary metal oxide semiconductor (CMOS) devices thereon and wherein the first inductor, second inductor, and transmission line are formed on an interposer or integrated passive device chip physically separate from, but electrically coupled to the integrated circuit die.

5. The band-pass filter of claim 1, further comprising:
    a first DC supply voltage coupled to the second source/drain terminal of the transistor.

6. The band pass filter of claim 5, further comprising:
    a second DC supply voltage coupled to the transmission line, the second DC supply voltage providing a different voltage level then the first DC supply voltage.

7. The band-pass filter of claim 1, wherein the respective matching circuits comprise respective capacitors arranged in series along the leg.

8. A band-pass filter having an input terminal and an output terminal, the band pass filter comprising:
    a first inductor-capacitor (LC) resonator having first and second LC terminals, the first LC terminal coupled to the input terminal;
    a first matching circuit having first and second terminals, the first terminal coupled to the input terminal;
    a second LC resonator having third and fourth LC terminals, the third LC terminal coupled to the second terminal of the first matching circuit;
    a second matching circuit having third and fourth terminals, the third terminal coupled to the fourth LC terminal;
    a third inductor-capacitor (LC) resonator having fifth and sixth LC terminals, the fifth LC terminal coupled to the fourth terminal of the second matching circuit;
    a third matching circuit having fifth and sixth terminals, the fifth terminal coupled to the fourth terminal of the second matching circuit; and
    a fourth LC resonator having seventh and eight LC terminals, the seventh LC terminal coupled to the sixth terminal and to the output terminal of the band-pass filter;
    wherein at least one of the LC resonators includes an active inductor comprising:
        a transistor having a gate terminal and first and second source/drain terminals;
        a first inductor having a first inductor terminal coupled to the first source/drain terminal; and
        a second inductor having a first inductor terminal coupled to the gate terminal.

9. The band-pass filter of claim 8, wherein the second LC terminal, fourth LC terminal, sixth LC terminal, eighth LC terminal are coupled to a DC supply voltage.

10. The band-pass filter of claim 8, wherein the second and third LC resonators comprise second and third active inductors, respectively.

11. The band-pass filter of claim 10, wherein the second or third active inductor comprises:
    a transistor having a gate terminal and first and second source/drain terminals;
    a first inductor having a first inductor terminal coupled to the first source/drain terminal;
    a second inductor having a first inductor terminal coupled to the gate terminal; and
    a transmission line coupled to respective second inductor terminals of the first and second inductors.

12. The band-pass filter of claim 11, wherein the transmission line is coupled to a first DC voltage supply.

13. The band-pass filter of claim 12, wherein the second LC terminal, fourth LC terminal, sixth LC terminal, eighth LC terminal are coupled to a second DC supply voltage, which provides a different voltage level then the first DC supply voltage.

14. The band-pass filter of claim 8, wherein the first, second, third, and fourth LC resonators comprise respective active inductors.

15. The band-pass filter of claim 14, wherein the respective active inductors comprise:
    a transistor having a gate terminal and first and second source/drain terminals;
    a first inductor having a first inductor terminal coupled to the first source/drain terminal;
    a second inductor having a first inductor terminal coupled to the gate terminal; and
    a transmission line coupled to respective second inductor terminals of the first and second inductors.

16. The band pass filter of claim 15, wherein the transistor, the first inductor, the second inductor and the transmission line are all formed on a single integrated circuit die having complementary metal oxide semiconductor (CMOS) devices thereon.

17. The band pass filter of claim 15, wherein the transistor is formed on an integrated circuit die having complementary metal oxide semiconductor (CMOS) devices thereon and wherein the first inductor, second inductor, and transmission line are formed on an interposer chip physically separate from, but electrically coupled to the integrated circuit die.

18. The band pass filter of claim 15, wherein the transistor is formed on an integrated circuit die having complementary metal oxide semiconductor (CMOS) devices thereon and wherein the first inductor, second inductor, and transmission line are formed on an integrated passive device chip physically separate from, but electrically coupled to the integrated circuit die.

* * * * *